United States Patent [19]
Börnert et al.

[11] Patent Number: 6,005,391
[45] Date of Patent: Dec. 21, 1999

[54] METHOD FOR DETERMINING THE SPATIAL AND/OR SPECTRAL DISTRIBUTION OF NUCLEAR MAGNETIZATION

[75] Inventors: Peter Börnert; Tobias Schäffter, both of Hamburg, Germany

[73] Assignee: U.S. Philips Corporation, New York, N.Y.

[21] Appl. No.: 08/749,937

[22] Filed: Nov. 14, 1996

[30] Foreign Application Priority Data

Nov. 18, 1995 [DE] Germany .................. 195 43 079

[51] Int. Cl.[6] ..................................... G01V 3/00
[52] U.S. Cl. ................................ 324/309; 324/307
[58] Field of Search ............................ 324/300, 307, 324/309, 310, 312; 600/410

[56] References Cited

U.S. PATENT DOCUMENTS

| | | | |
|---|---|---|---|
| 5,545,990 | 8/1996 | Kiefer et al. .......................... | 324/307 |
| 5,612,619 | 3/1997 | Feinberg ............................... | 324/309 |

OTHER PUBLICATIONS

"Methods and Algorithms for Fourier–Transform Nuclear Magnetic Resonance Tomography", vol. 4, No. 5, May 1987/ J. Opt. Soc. Am. A, Z.H. Cho and O. Malcioglu, H.W. Park.

"Wavelet–Encoded MR Imaging", John B. Weaver, Yansun Xu, Dennis M. Healy, and James R. Driscoll, Magnetic Resonance in Medicine 24, 275–287 (1992).

J. Magn. Reson. 82, 647–654 (1989).

J. Magn. Reson. Med. 15, 287–304 (1990).

"Double Echo Multislice Proton Spectroscopic Imaging" From Magnetic Resonance in Medicine, Bd. Seiten 596–600, W. Dreher, D. Leibfritz Dec. 1992.

Dreher et al. "Double–Echo Multislice Proton Spectroscopic Imaging Using Hadamard Slice Encoding" Magnetic Resonance in Medicine, vol. 31, pp. 596–600, 1994.

Hardy et al. "Spatial Localization in Two Dimensions Using NMR Designer Pulses" Journal of Magnetic Resonance 82, 647–654, 1989.

Meyer et al. "Simultaineous Spatial and Spectral Selective Excitation" Magnetic Resonance in Medicine 15, 287–304, 1990.

*Primary Examiner*—Louis Arana
*Attorney, Agent, or Firm*—Dwight H. Renfrew, Jr.

[57] ABSTRACT

A method of determining the spatial and/or spectral distribution of nuclear magnetization in separate regions (which are not coherent in respect of space or frequency) utilizes multi-dimensional RF pulses which are configured such that it is possible to determine the nuclear magnetization distribution in the individual regions from a linear combination of the MR signals occurring subsequent to an excitation (or from MR data derived therefrom). This results in shorter measuring times or a more attractive signal-to-noise ratio.

11 Claims, 5 Drawing Sheets

METHOD FOR DETERMINING THE SPATIAL AND/OR SPECTRAL DISTRIBUTION OF NUCLEAR MAGNETIZATION

BACKGROUND OF THE INVENTION

1. Field of the Invention

The invention relates to a method of determining the spatial and/or spectral distribution of the nuclear magnetization in separate regions within an object.

For MR examinations (MR=Magnetic Resonance) it is often desirable to examine spatially separate regions of an object:

a) For example, for in-vivo spectroscopy it is important to acquire reference spectra from non-pathological regions for the evaluation of the spectral nuclear magnetization distribution in a diagnostically relevant region.

b) In the MR imaging processes often only given regions of the overall image are of diagnostic interest, so that it is not necessary to image the entire examination zone. The possibility to image only given regions can then be advantageous if the examination zone contains highly vascularized regions which are not of diagnostic interest and could cause strong flow artefacts. In that case it is desirable to excite and to image only the other regions.

c) Furthermore, it is often important to generate separate fat or water images in different regions, for example in two different planes. The fat or water images are then formed from different frequency ranges of the MR signals. In this case, therefore, there is a total of four separate regions (two spatially separated and two frequency separated regions) in which the nuclear magnetization distribution is to be determined.

It is already known that the nuclear magnetization can be excited or refocused in arbitrarily shaped, spatially multi-dimensional regions by means of so-called multi-dimensional RF pulses. Multi-dimensional RF pulses are amplitude and/or phase-modulated pulses which, in the presence of temporally varying magnetic gradient fields, excite longitudinal magnetization or refocus transverse magnetization. Such multi-dimensional RF pulses are described in J Magn. Reson. 82, 647–654 (1989). Moreover, the publication Magn. Reson. Med. 15, 287–304 (1990) describes the formation of RF pulses which are spatially and spectrally selective at the same time and enable excitation of each time one of several spatially and frequency-wise separated regions. These pulses are also to be considered as multi-dimensional RF pulses.

SUMMARY OF THE INVENTION

It is an object of the present invention to provide an improved method of the kind set forth. Assuming the number of separate regions to be n, this object is achieved in accordance with the invention by taking the following steps:

a) Predetermining n linearly independent codes of the phase and/or the amplitude of the nuclear magnetization in the n separate regions.

b) Generating n different multi-dimensional RF pulses which are shaped so that the nuclear magnetization is excited only in the n regions, that is to say always in conformity with one of the n codes.

c) Acquiring of the MR signals appearing subsequent to the excitation of the nuclear magnetization in the regions.

d) Forming linear combinations of the MR signals, or MR data linearly derived therefrom, in order to determine the nuclear magnetization distribution in a respective one of the regions.

Thus, in accordance with the invention the arbitrarily shaped regions to be examined are not individually (successively) excited, but simultaneously. Consequently, an MR signal resulting from such excitation is composed of signal components from the various regions, which components can no longer be simply assigned to the individual regions. In order to enable reconstruction of the nuclear magnetization distribution in the individual regions nevertheless, n different RF pulses are generated, i.e. as many different RF pulses as there are separate regions. The pulses are conceived in such a manner that they are capable of exciting the nuclear magnetization in the regions with a different code, so that the nuclear magnetization distribution in the individual regions can be determined by forming a linear combination of the MR signals originating from measurements using the various RF pulses.

In order to ensure that this determination is unambiguous, the codes of the n RF pulses must be linearly independent (i.e. none of the codes may result from a linear combination of the other codes).

The advantage of the invention consists in that, the measuring time being the same, a signal-to-noise ratio is obtained which is better than if the nuclear magnetization in the individual regions were measured consecutively. It is also an advantage that the measurements in the individual regions are simultaneously performed, so that the distributions obtained are related better than if they were consecutively measured. In comparison with two-dimensional or three-dimensional imaging methods which image the entire object, including the areas not of interest, there is the advantage that the measuring time can be reduced and that the sensibility to artefacts is reduced, because structures susceptible to artefacts are not at all influenced by the RF pulses, so that they cannot develop into a cause of artefacts either.

In a further embodiment for the examination of spatially separated regions, spatially multi-dimensional RF pulses are used and the steps c) and possibly b) are repeated a number of times, after each RF pulse and before the acquisition of the resultant MR signal there being generated a first magnetic gradient field having a phase-encoding gradient extending in a first direction, its time integral being varied before each new acquisition of an MR signal. As a result of the magnetic gradient field which is varied from one repeat to another, a spatial resolution in the direction of the gradient is obtained. If in a further embodiment of the invention it is ensured that during the acquisition of the MR signals a respective magnetic gradient field is always applied with a gradient extending in a third direction which is perpendicular to the direction of the phase-encoding gradient(s), the spatial distribution of the nuclear magnetization can be determined in the n separate regions. The advantage over the conventional method of two-dimensional determination of the nuclear magnetization distribution consists in that, generally speaking, for the same resolution the number of repeats can be lower so that the measuring time is reduced.

The same holds when in a version of the method the steps c) and possibly b) are repeated in a plurality of cycles, the time integral over the first gradient field being varied from one cycle to another, each cycle itself comprising a plurality of repeats, a second magnetic gradient field with phase encoding in a second direction being generated prior to renewed acquisition of the resultant MR signal, its time integral being varied from one repeat to another. In conjunction with a read gradient in a direction perpendicular to the phase-encoding gradient, this enables three-dimensional determination in the spatially separated regions, it being possible for the measuring time to be shorter, generally speaking, than in conventional methods for the three-dimensional determination of the nuclear magnetization distribution.

In a further embodiment of the invention, spatially multi-dimensional RF pulses are used and for the determination of the spectral nuclear magnetization distribution in the regions no magnetic gradient fields are applied during the acquisition of the MR signals. This enables separate determination of the spectral nuclear magnetization distribution in the individual spatial regions, the signal-to-noise ratio then being better than if the individual regions were individually and consecutively excited by corresponding RF pulses.

In another embodiment of the invention, a plurality of spatially separate regions are excited in a plurality of separate frequency ranges, the number of codes or different RF pulses corresponding to the product of the number of the spatially separate regions and the number of frequency ranges. This enables, for example, determination of fat and water images in two separate areas simultaneously.

An MR apparatus for carrying out the method in accordance with the invention includes:

a) an RF coil system for generating RF pulses,
b) a gradient coil system for generating temporally variable magnetic gradient fields,
c) a coil system for receiving MR signals,
d) a reconstruction unit for reconstructing the nuclear magnetization distribution from the MR signals received,
e) means for predetermining the phase and/or the code in n separate regions,
f) a control unit for controlling the components in such a manner that the following steps are carried out:
  1) generating n different RF pulses which are shaped so that the nuclear magnetization is excited only in the n regions, that is to say each time in conformity with one of the n codes,
  2) acquiring the MR signals occurring subsequent to the excitation of the nuclear magnetization in the regions.
  3) forming linear combinations of the MR signals, or MR data linearly derived therefrom, in order to determine the nuclear magnetization distribution in a respective one of the regions.

BRIEF DESCRIPTION OF THE DRAWINGS

The invention will be described in detail hereinafter with reference to the drawings. Therein.

DETAILED DESCRIPTION OF THE PREFERRED EMBODIMENTS

Figure 1:
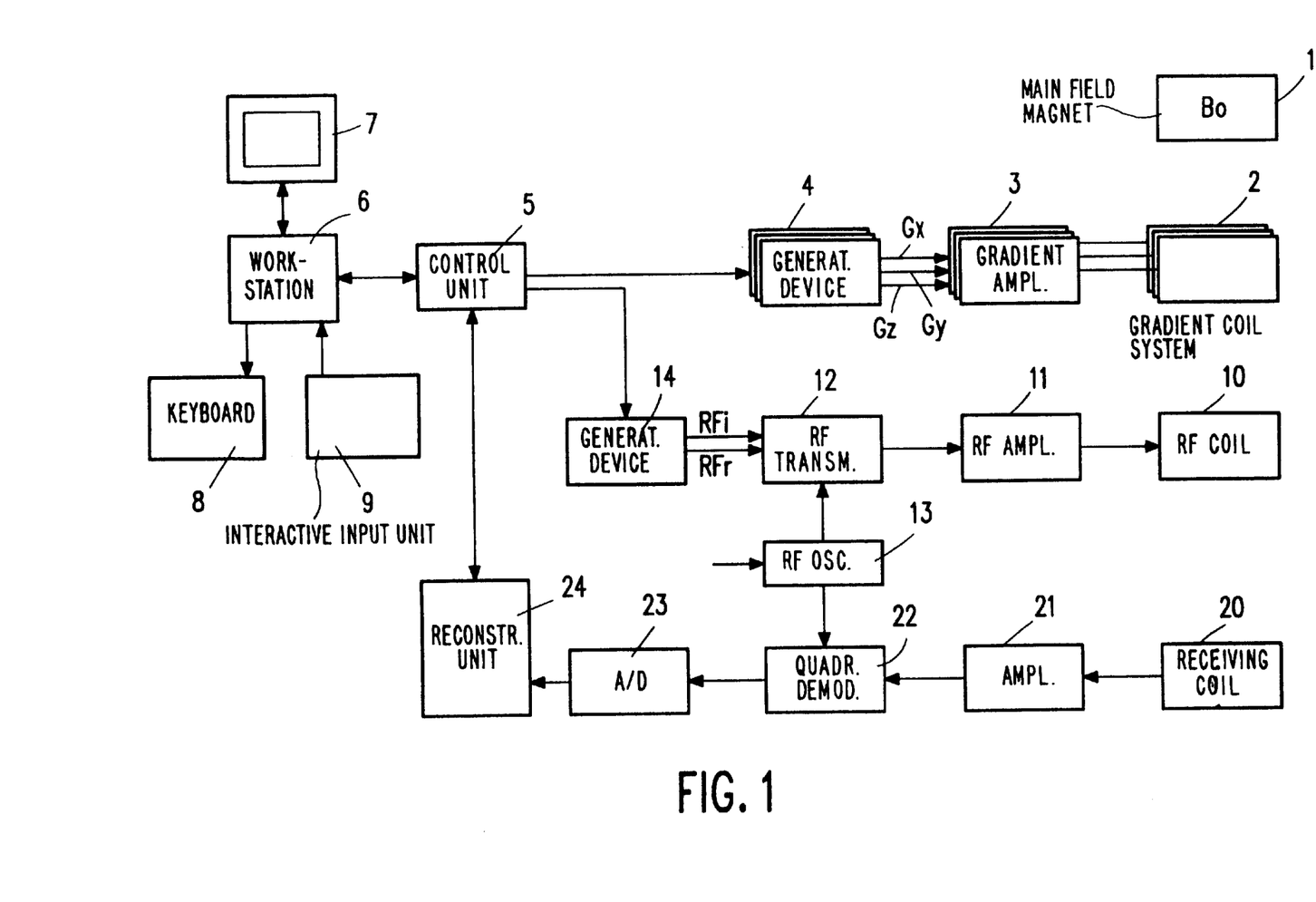
FIG. 1 shows the block diagram of an MR apparatus whereby the invention can be carried out.

The reference 1 in FIG. 1 denotes a main magnetic field magnet which generates a steady, uniform magnetic field having a strength of, for example 1.5 tesla which extends in the z-direction in an examination zone (not shown). There is also provided a gradient coil system 2 which is capable of generating magnetic gradient fields which extend in the z-direction in the examination zone and have a gradient in the x, the y or the z direction. The gradient coil system 2 is fed by a gradient amplifier device 3. The variation in time of the magnetic gradient fields is predetermined by a generator device 4 which is controlled by a control unit 5. The control unit 5 cooperates with a workstation 6. The workstation 6 includes a monitor 7 for the display of MR images. Entries can be made via a keyboard 8 or via an interactive input unit 9, for example a light pen.

The nuclear magnetization in the examination zone can be excited by RF pulses from an RF coil 10 which is connected to an RF amplifier 11 which amplifies the output signals of an RF transmitter 12. In the high-frequency transmitter the complex envelopes $RF_i$ and $RF_r$ of the RF pulse are modulated with two 90° offset carrier oscillations supplied by an oscillator 13 whose frequency corresponds to the Larmor frequency (approximately 63 MHz in the case of a main field of 1.5 tesla). The control unit 5 loads the complex envelopes $RF_i$ and $RF_r$ into a generator 14 coupled to the transmitter 12.

The MR signals produced in the examination zone are received by a receiving coil 20 and amplified by an amplifier 21. The amplified signal is demodulated in a quadrature demodulator 22 and applied, via an analog-to-digital converter 23, to a reconstruction unit 24 which reconstructs an image of the MR distribution from the digitized MR signals. This image can be displayed on the monitor 7.

Figure 2:
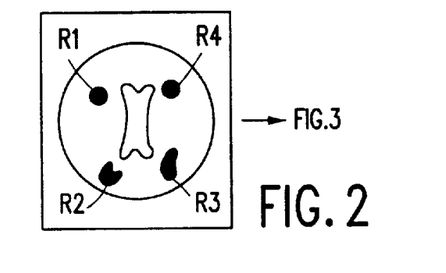
FIG. 2 shows an MR survey image.

In MR spectroscopy it is advantageous to define, on the basis of an MR image, the regions wherefrom an MR spectrum is to be determined. Because the absolute evaluation of such spectra is often questionable because of the large differences between different patients, it is necessary to utilize reference values from non-pathological regions. To this end, four separate, i.e. spatially non-coherent regions R1 . . . R4 whose MR spectrum is to be determined are defined in a slice image (FIG. 2) formed in a customary manner and displayed on the monitor 7. In principle, however, the regions to be examined can also be predetermined automatically by means of suitable image processing methods.

Figure 3:
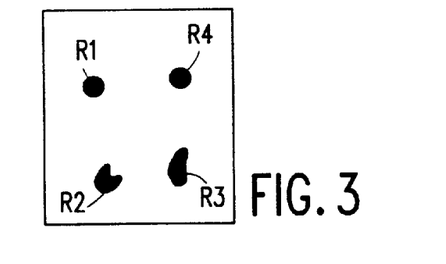
FIG. 3 shows some selected regions of the survey image.

For these four regions, shown separately from the remainder of the MR image in FIG. 3, four linearly independent codes of the phase of the transverse magnetization are predetermined. The code for the various regions can be predetermined, for example as follows:

| Pulse | R1 | R2 | R3 | R4 | MR signal |
|---|---|---|---|---|---|
| 1 | + | + | + | + | ->S1 |
| 2 | + | + | − | − | ->S2 |
| 3 | + | − | − | + | ->S3 |
| 4 | + | − | + | − | ->S4 |

Therein, "+" means that in the relevant region the transverse magnetization has the phase position zero in a co-rotating coordinate system, whereas "−" means that the transverse magnetization in the relevant region must have a 180° phase position.

This code diagram corresponds to a four-point Hadamard transformation. The code could in principle also be predetermined interactively by the user, but it can also be automatically predetermined by the workstation 6 as soon as the number of regions is known. Instead of the encoding of the nuclear magnetization in the regions in conformity with a Hadamard transformation, alternatively arbitrary other codes can be used for as long as they are linearly independent. This includes also the wavelet or the Fourier transformation. These and further transformations are described inter alia in Magn. Reson. Med. 24, 265–287 (1992) as well as in J. Opt. Soc. Amer., A4, 923–932, 1989.

After predetermination of the code, the complex envelopes of four two-dimensional RF pulses can be calculated as excitation pulses in such a manner that the signs of the transverse magnetization produced thereby corresponds to the predetermined code in the individual regions. A spatially two-dimensional RF pulse is a pulse accompanied by temporally variable magnetic gradient fields with gradients extending in two mutually perpendicular directions. The calculation of the envelopes of such RF pulses is described in the magazine J. Magn. Reson. 82, 647–654 (1989).

Figure 4:
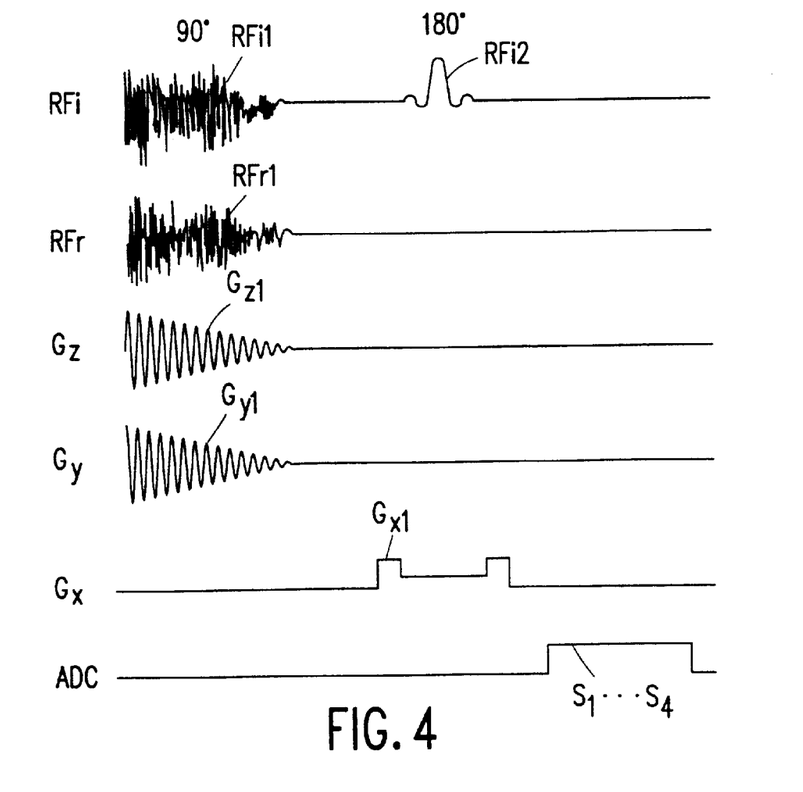
FIG. 4 shows the variation in time of various signals of a sequence for spectroscopic evaluation of these regions.

The first two lines of FIG. 4 show the temporal variations of the complex envelopes $RF_{i1}$ and $RF_{r1}$ of one of the four RF pulses, accompanied by cosinusoidal or sinusoidal gradient fields of linearly decreasing amplitude with gradients $G_{z1}$ and $G_{y1}$ extending in the z-direction and the y-direction, respectively. Such a two-dimensional RF pulse excites the nuclear magnetization in the four regions R1 . . . R4 that is to say exclusively in these regions, the phase position of the transverse magnetization in the individual regions corresponding to one of the predetermined codes. Subsequent to this two-dimensional RF pulse, the sequence includes a slice-selective refocusing RF pulse $RF_{i2}$ which is accompanied by a magnetic gradient field $G_{x1}$ with a gradient in the x-direction. The examination is thus limited to the slice which extends perpendicularly to the x direction and whose transverse magnetization is refocused by the RF pulse $RF_{i2}$.

The MR signal occurring after this RF pulse $RF_{i2}$, for example the signal S1, is received and converted into a digital signal by the analog-to-digital converter 23. The Fourier transform of this signal represents the MR spectrum of all four regions R1 . . . R4.

The sequence shown in FIG. 4 is repeated a second, a third and a fourth time; however, the control unit then loads the envelopes $RF_{i1}$, $RF_{r1}$ of the second, the third and the fourth two-dimensional RF pulse, respectively, into the generator 14, so that the signals S2, S3 and S4, respectively are obtained. If necessary, these four sequences can also be repeated a number of times.

The MR spectrum in the individual regions R1 . . . R4 can be determined by means of suitable linear combinations of the MR signals S1 . . . S4 or the MR spectra determined therefrom. For example, the signal S(R1) for the region R1 is calculated in conformity with the formula:

S(R1)=S1+S2+S3+S4, whereas, for example for the signal S(R4) for the region R4 it holds that:

S(R4)=S1−S2+S3−S4.

This operation corresponds to a four-point Hadamard back-transformation.

When the spectral nuclear magnetization distribution is determined in the described manner, the signal-to-noise ratio is a factor √n better than in the case of separate, consecutive determination of the MR spectra of the individual regions; thus, in the present case it is a factor 2 better.

Instead of determining the spectral distribution of the nuclear magnetization, it is alternatively possible to image the spatially separated regions spatially. This will be described in detail hereinafter with reference to the FIGS. 5 to 7.

Figure 5:
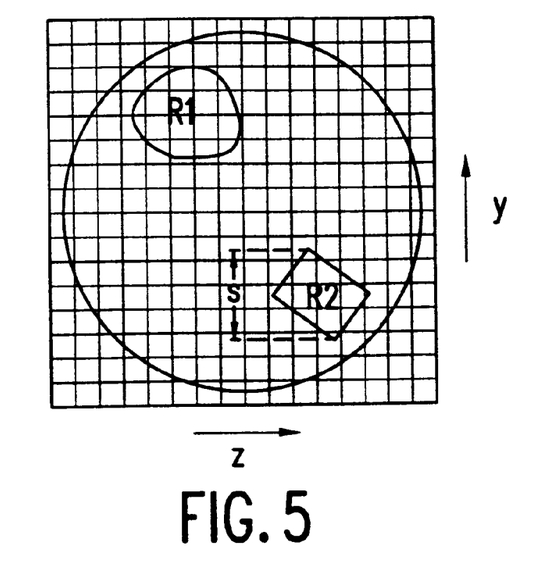
FIG. 5 shows a two-dimensional image of an object with selected regions.

FIG. 5 shows a two-dimensional MR image. An image of this kind can be formed by means of conventional MR imaging methods in which the entire image field is measured in such a manner so that it can be imaged on an M×N matrix. Therein, M is the number of data points in the direction of the read gradient and N is the number of sequences to be generated with a changed phase-encoding gradient. However, often only selected regions are of interest in such an image, for example the regions denoted by the references R1 and R2 in the image. The remainder of the image field may contain blood vessels or other sources of strong flow artefacts which are not to be imaged. Therefore, it is desirable to form MR images showing exclusively the regions R1 and R2.

Figure 7:
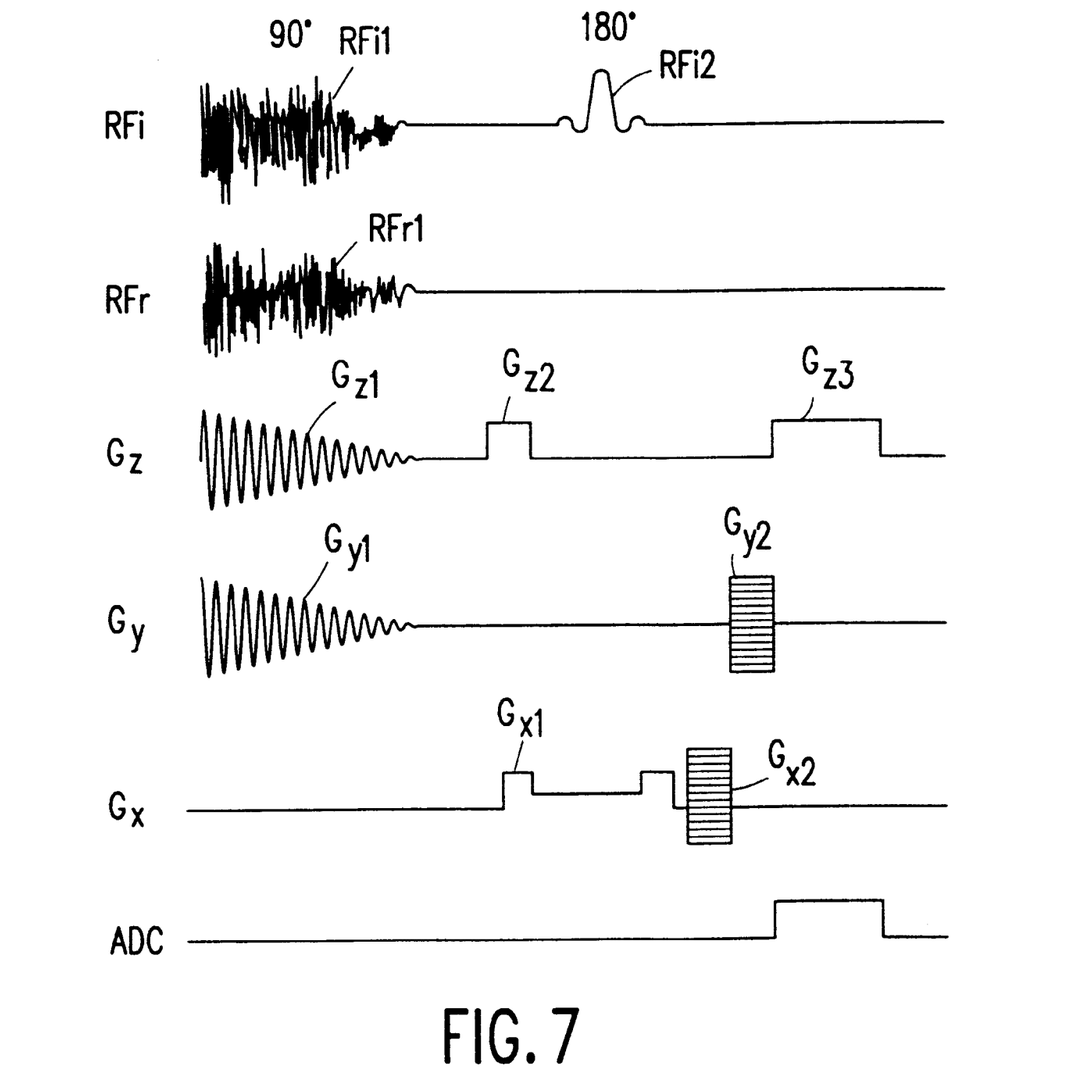
FIG. 7 shows the variation in time of the signals of a sequence suitable for the imaging of the regions of the FIGS. 5 and 6.

FIG. 7 shows a single sequence for the simultaneous excitation of the regions R1 and R2 in FIG. 5. The sequence shown in FIG. 7 substantially corresponds to that shown in FIG. 4, merely a magnetic gradient field $G_{z3}$ being applied in the z-direction during the reading of the MR signal, said gradient field being preceded by a magnetic gradient field $G_{z3}$ whose time integral amounts to half of that of $G_{z3}$, and between the 180° pulse $RF_{i2}$ and the two-dimensional RF pulse $RF_{i1}$ there is applied a gradient field $G_{x2}$ which varies as a function of time. Moreover, prior to the reading out of the MR signal a phase-encoding gradient $Gy_2$ which acts in the y direction is activated, it being necessary to repeat said gradient s times, the phase-encoding gradient being varied in steps from one repeat to another. The number s results from the larger dimension of the two regions in phase encoding, divided by the spatial resolution dr, or it indicates how many pixels are present in the direction of the phase-encoding gradient in the region (R2) which is larger in this direction. Because the two-dimensional pulse excites both spatially separated regions R1 and R2 (but exclusively these two regions), it would no longer be possible to distinguish the two regions from one another after the reconstruction in the phase-encoding direction, and folding artefacts would occur. In order to avoid such folding artefacts, the two regions R1 and R2 are exposed to two different two-dimensional RF pulses which encode the phase of the nuclear magnetization in these regions as follows:

| Pulse | R1 | R2 | MR signal |
| --- | --- | --- | --- |
| 1 | + | + | −>S1 |
| 2 | + | − | −>S2 |

The calculation of the envelopes for these two different two-dimensional RF pulses is performed as described with reference to FIG. 4. The reconstruction of the nuclear magnetization distribution in the individual regions is again performed by way of linear combination of the MR signals S1, S2, i.e.:

S(R1)=S1+S2, and

S(R2)=S1−S2.

This is equivalent to a two-point Hadamard transformation or a two-point Fourier transformation. Instead of combining the MR signals in the described manner, their Fourier transforms, or also the images reconstructed from the MR signals S1 and S2 in conjunction with the phase encoding, can be superposed in the described manner. This yields the Fourier transform for the two regions or directly an MR image of the two regions.

In comparison with a conventional MR imaging method the described method then offers the advantage that, if the product of the number of regions n and the number s is smaller than the number N of phase-encoding steps required, in the case of a standard 2 DFT method, for reconstructing the overall image with the same resolution dr. In order to derive full benefit from this measuring time advantage, the direction of the read gradient (being the z-direction in the example) and the direction of the phase-encoding gradient (y in the example) should be chosen so that the maximum dimension of the regions in the phase-encoding direction is as small as possible.

Figure 6:
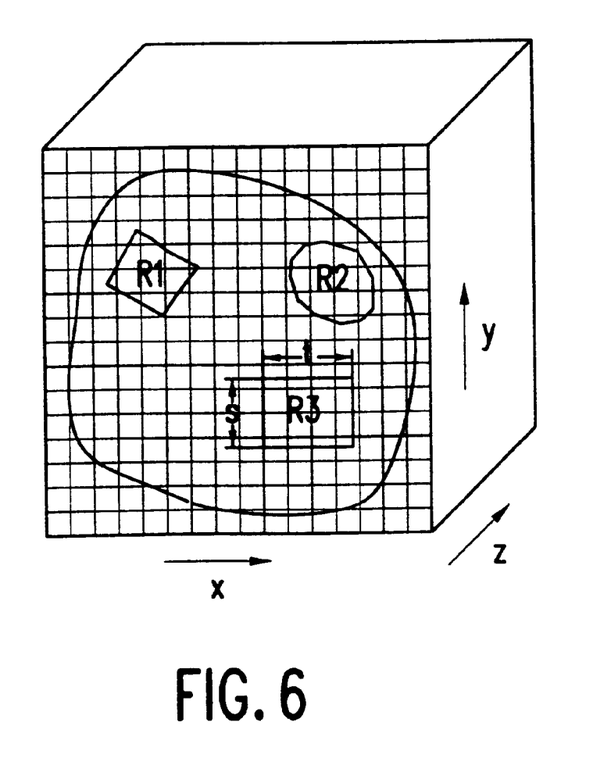
FIG. 6 is a three-dimensional representation of an object with selected regions.

The above description can also be extended to a three-dimensional case. FIG. 6 illustrates such a three-dimensional case where the nuclear magnetization distribution is to be determined in three non-coherent regions R1, R2 and R3. Two spatial directions (x, y) must then be phase encoded whereas the read gradient extends in the third direction which is perpendicular thereto. It is assumed that R3 has the largest dimensions of the three regions in the x direction as well as in the y direction, its length in the x direction amounting to t pixels and that in its y direction to s pixels.

The sequence of FIG. 7, given in conjunction with FIG. 5, should then be modified in such a manner that the slice-selective pulse $R_{f2}$ and the selection gradient $G_{x1}$ would be omitted and instead a phase-encoding gradient $G_{x2}$ would be applied and repeated t times. Moreover, the sign of $G_{z2}$ should be reversed. In comparison with a conventional image of the overall region as obtained by means of a 3 DF method, in which the overall image was also phase encoded in two directions, a measuring time advantage is then obtained if the condition n.s.t<N.K were satisfied. Therein, n is the number of spatially separated regions, and N and K are the numbers of pixels in the x-direction and in the y-direction, respectively, for a standard 3 DFT method. Generally speaking, this condition is satisfied already with simple local limitations of the regions R1, R2 and R3, so that the measuring time is drastically reduced.

If the read gradient $G_{z3}$ and the defocusing gradient $G_{z2}$ are omitted for acquisition of the MR signal, spatial two-dimensional resolution spectroscopic imaging is obtained.

The determination of the spatial distribution of the nuclear magnetization in the various regions as described with reference to the FIGS. 5 to 7 was based on 2 DFT or 3 DFT methods requiring renewed excitation of the nuclear magnetization in the relevant regions prior to each acquisition of the MR signal. The invention, however, can also be used in conjunction with MR methods which, like EPI or the like, read, subsequent to an excitation RF pulse, several MR signals with an alternating polarity of the read gradient. Prior to each read operation, the phase in a first direction, extending perpendicularly to the read direction, is changed by a brief pulse (blip) (for a two-dimensional image). Analogously, upon acquisition of the nuclear magnetization distribution in a three-dimensional region, phase encoding is performed in a second direction which extends perpendicularly to the first direction and to the direction of the read gradient.

The limitation of the excitation of the nuclear magnetization to the selected regions can then again result in a reduction of the number of MR signals required for a reconstruction.

Figure 8:
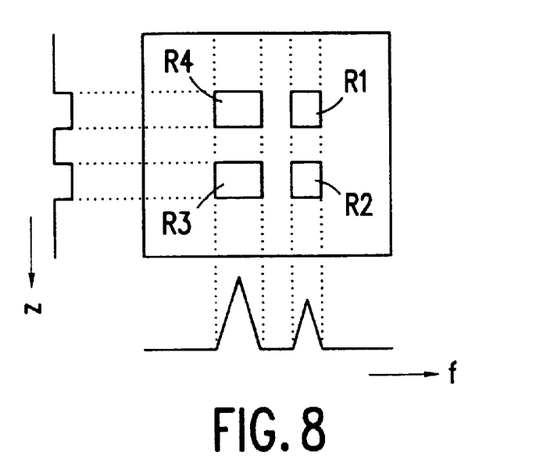
FIG. 8 shows the position of regions which are separated in respect of space and frequency.

For the description of the invention it was assumed that the non-coherent regions are spatial two-dimensional or three-dimensional regions. The invention, however, can also be used for the case involving one spatial and one spectral dimension. Such a constellation occurs, for example if a fat image and a water image are to be determined in two planes offset in the z-direction (fat and water images have slightly different frequencies because of the chemical shift). This corresponds to the reconstruction of the nuclear magnetization distribution in four regions of the (z,f) space (z=position coordinate, f=frequency) as shown in FIG. 8.

Figure 9:
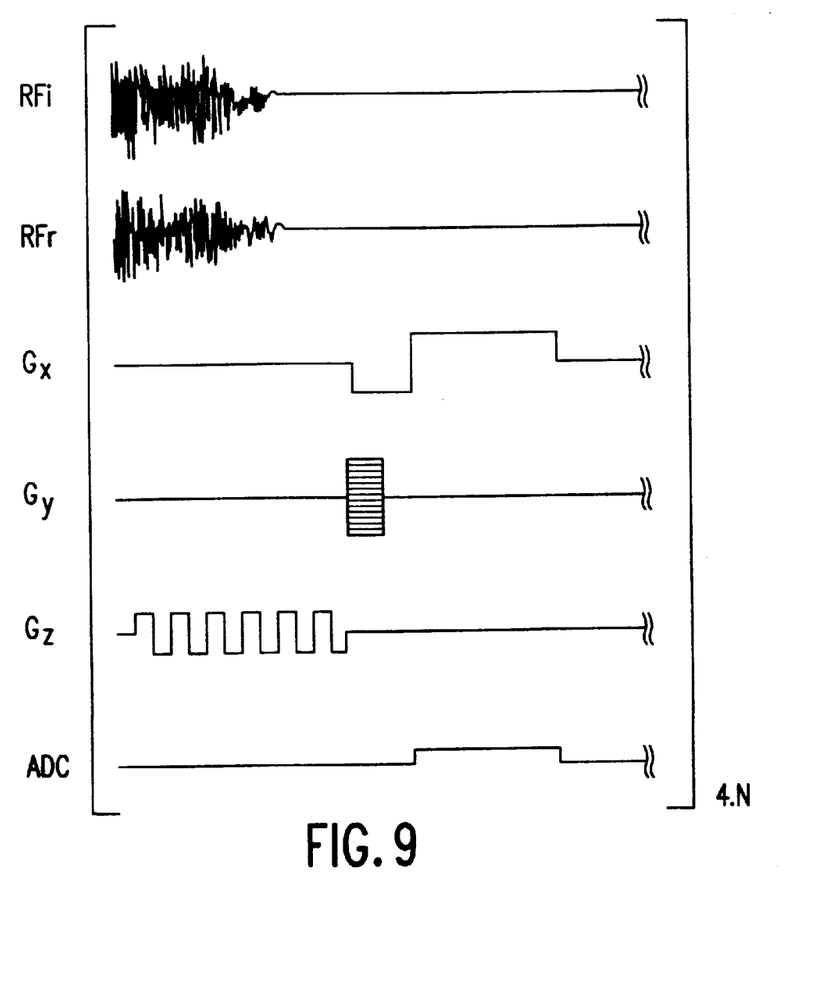
FIG. 9 shows a sequence suitable for imaging these regions.

FIG. 9 shows a sequence suitable for this purpose. Magn. Reson. Med. 15, 287–304 (1990) describes in detail how to generate RF pulses which excite the nuclear magnetization spatially and spectrally selectively at the same time. For the four regions of FIG. 8 four of such pulses are required, which pulses encode the nuclear magnetization in the four regions in a different manner. Such pulses can be used to perform a customary MR imaging operation in conjunction with the customary read gradients ($G_x$) or phase-encoding gradients ($G_y$).

The sequence shown in FIG. 9 must be repeated 4N times, so that no measuring time advantages are achieved in comparison with a method in which the fat and water images are consecutively determined in the two planes. Because the spatially and spectrally selective RF pulses excite all four regions simultaneously, however, a signal-to-noise ratio is obtained which is a factor 2 better.

We claim:

1. A method of determining the spatial or spectral distribution of the nuclear magnetization in n spatially separate regions within an object, including the following steps:
    a) predetermining n linearly independent codes of the phase or the amplitude of the nuclear magnetization in the n spatially separate regions,
    b) generating n different spatially multi-dimensional RF pulses which are shaped so that the nuclear magnetization is excited only in the n regions, that is to say always in conformity with one of the n codes,
    c) generating a first magnetic gradient field having a phase-encoding gradient extending in a first direction,
    d) acquiring MR signals appearing subsequent to the excitation of the nuclear magnetization in the regions by the spatially multi-dimensional RF pulses,
    e) repeating step d) s times, s being a number of pixels of a largest of the n regions in a phase encoding direction, wherein the time integral of the first magnetic gradient field is varied before each new acquisition of an MR signal, and
    f) forming linear combinations of the MR signals, or MR data linearly derived therefrom, in order to determine the nuclear magnetization distribution in a respective one of the regions.

2. A method as claimed in claim 1, characterized in that at least the step d is repeated in a plurality of cycles, the time integral over the first gradient field being varied from one cycle to another, each cycle itself comprising t repetitions, t being a number of pixels of the largest of the n regions in a second phase encoding direction, a second magnetic gradient field with phase encoding in a second direction being generated prior to renewed acquisition of the resultant MR signal, its time integral being varied from one repetition to another.

3. A method as claimed in claim 2, characterized in that during each acquisition of an MR signal a magnetic gradient field is applied whose gradient extends in a third direction which is perpendicular to the direction of the phase-encoding gradient(s).

4. A method as claimed in claim 2, characterized in that spatially multi-dimensional RF pulses are used and that for the determination of the spectral nuclear magnetization distribution in regions no magnetic gradient fields are applied during the acquisition of the MR signals.

5. A method as claimed in claim 1, characterized in that during each acquisition of an MR signal a magnetic gradient field is applied whose gradient extends in a third direction which is perpendicular to the direction of the phase-encoding gradient(s).

6. A method as claimed in claim 1, characterized in that spatially multi-dimensional RF pulses are used and that for the determination of the spectral nuclear magnetization distribution in regions no magnetic gradient fields are applied during the acquisition of the MR signals.

7. A method as claimed in claim 1, characterized in that a plurality of spatially separate regions are excited in a plurality of separate frequency ranges, and that the number of codes or the different RF pulses corresponds to the product of the number of the spatially separate regions and the number of frequency ranges.

8. An MR apparatus for carrying out the method claimed in claim 1, comprising:
   a) an RF coil system for generating RF pulses,
   b) a gradient coil system for generating temporally variable magnetic gradient fields,
   c) a coil system for receiving MR signals,
   d) a reconstruction unit for reconstructing the nuclear magnetization distribution from the MR signals received,
   e) an interaction unit (9) for defining n arbitrarily shaped, spatially separate regions,
   f) means for predetermining the phase or the code in n separate regions,
   g) a control unit for controlling the components in such a manner that the following steps are carried out:
      1) generating n different spatially multi-dimensional RF pulses which are shaped so that the nuclear magnetization is excited only in the n regions, that is to say each time in conformity with one of the n codes,
      2) generating a first magnetic gradient field having a phase-encoding gradient extending in a first direction,
      3) acquiring the MR signals occurring subsequent to the excitation of the nuclear magnetization in the regions by the spatially multi-dimensional RF pulses,
      4) repeating step 3) s times, s being a number of pixels of a largest of the n regions in a phase encoding direction, wherein the time integral of the first magnetic gradient field is varied before each new acquisition of an MR signal, and
      5) forming linear combinations of the MR signals, or MR data linearly derived therefrom, in order to determine the nuclear magnetization distribution in a respective one of the regions.

9. A method as claimed in claim 1, characterized in that spatially multi-dimensional RF pulses are used and that for the determination of the spectral nuclear magnetization distribution in regions no magnetic gradient fields are applied during the acquisition of the MR signals.

10. A method of determining the spatial or spectral distribution of the nuclear magnetization in n separate coplanar regions within an object, including the following steps:
   a) predetermining n linearly independent codes of the phase or the amplitude of the nuclear magnetization in the n separate coplanar regions,
   b) generating n different multi-dimensional RF pulses which are shaped so that the nuclear magnetization is excited only in the n coplanar regions, that is to say always in conformity with one of the n codes,
   c) acquiring signals appearing subsequent to the excitation of the nuclear magnetization in the coplanar regions, and
   d) forming linear combinations of the MR signals, or MR data linearly derived therefrom, in order to determine the nuclear magnetization distribution in a respective one of the coplanar regions.

11. A method of determining the spectral distribution of the nuclear magnetization in n spatially separate regions within an object, including the following steps:
   a) predetermining n linearly independent codes of the phase or the amplitude of the nuclear magnetization in the n spatially separate regions,
   b) generating n different spatially multi-dimensional RF pulses which are shaped so that the nuclear magnetization is excited only in the n regions, that is to say always in conformity with one of the n codes,
   c) acquiring MR signals appearing subsequent to the excitation of the nuclear magnetization in the regions, without application of any magnetic gradient fields, and
   d) forming linear combinations of the MR signals, or MR data linearly derived therefrom, in order to determine the nuclear magnetization distribution in a respective one of the regions.

* * * * *